United States Patent [19]
Ovshinsky et al.

[11] Patent Number: 5,411,592
[45] Date of Patent: May 2, 1995

[54] APPARATUS FOR DEPOSITION OF THIN-FILM, SOLID STATE BATTERIES

[75] Inventors: Stanford R. Ovshinsky, Bloomfield Hills; Herbert Ovshinsky, Oak Park; Rosa Young, Troy, all of Mich.

[73] Assignee: Ovonic Battery Company, Inc., Troy, Mich.

[21] Appl. No.: 254,392

[22] Filed: Jun. 6, 1994

[51] Int. Cl.$^6$ .............. C23C 16/00; H01M 4/00; H01M 6/00

[52] U.S. Cl. .............. 118/718; 118/719; 118/50; 118/314; 118/325; 429/127; 429/162; 204/298.25; 204/298.26

[58] Field of Search .............. 118/719, 50, 314, 325, 118/718; 429/162, 127; 204/298.25, 298.26

[56] References Cited

U.S. PATENT DOCUMENTS

| | | | |
|---|---|---|---|
| 4,172,319 | 10/1979 | Bloom | 429/162 |
| 4,579,792 | 4/1986 | Bruder | 429/162 |
| 4,692,233 | 9/1987 | Casey | 118/719 |
| 5,090,356 | 2/1992 | Nath | 118/718 |
| 5,096,667 | 3/1992 | Fetcenko | 429/57 |
| 5,097,800 | 3/1992 | Shaw | 118/719 |
| 5,326,652 | 7/1994 | Lake | 429/127 |
| 5,344,728 | 9/1994 | Ovshinsky | 429/223 |
| 5,348,822 | 9/1994 | Ovshinsky | 429/223 |

*Primary Examiner*—Richard Bueker
*Attorney, Agent, or Firm*—David W. Schumaker; Marvin S. Siskind; Marc J. Luddy

[57] ABSTRACT

A multi-chambered deposition apparatus for depositing solid-state, thin-film battery materials onto substrate material. The apparatus minimally includes at least three distinct evacuable deposition chambers, which are physically interconnected in series. The first deposition chamber is adapted to deposit a layer of battery electrode material having a first polarity onto the substrate. The second deposition chamber is adapted to deposit a layer of solid-state electrolyte material onto the layer of battery electrode material deposited in the first chamber. The third deposition chamber is adapted to deposit a layer of battery electrode material having an opposite polarity from that deposited in the first chamber onto the solid-state electrolyte. The deposition chambers are interconnected by gas gates such that the substrate material is allowed to proceed from one deposition chamber to the next, while maintaining gaseous segregation between the chambers.

15 Claims, 3 Drawing Sheets

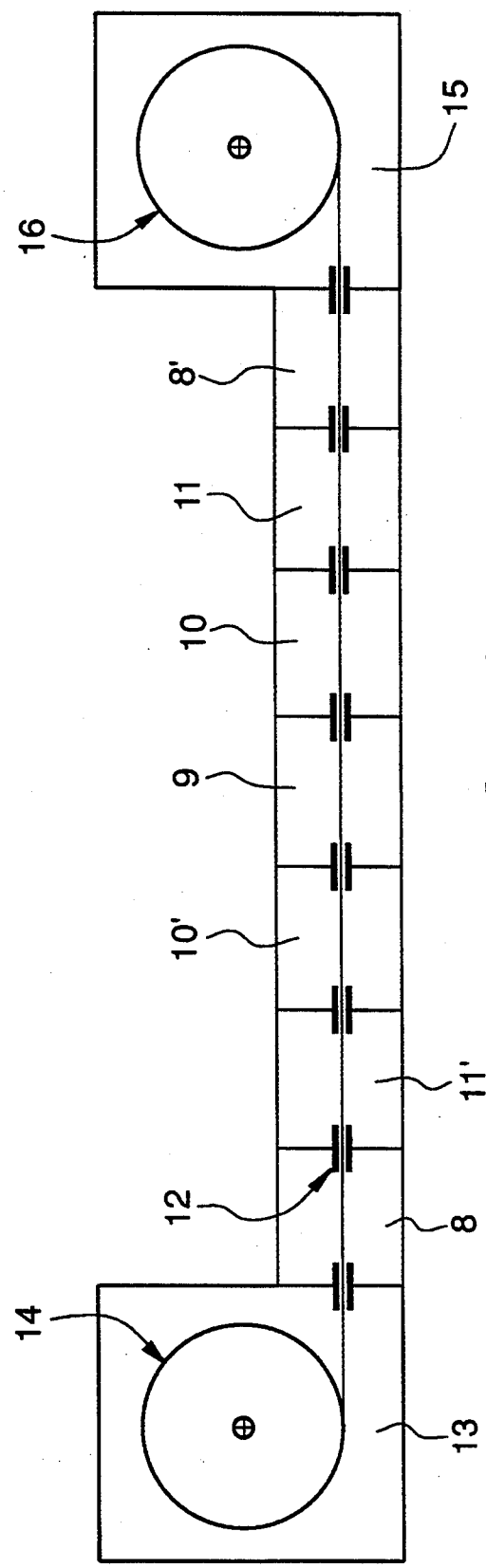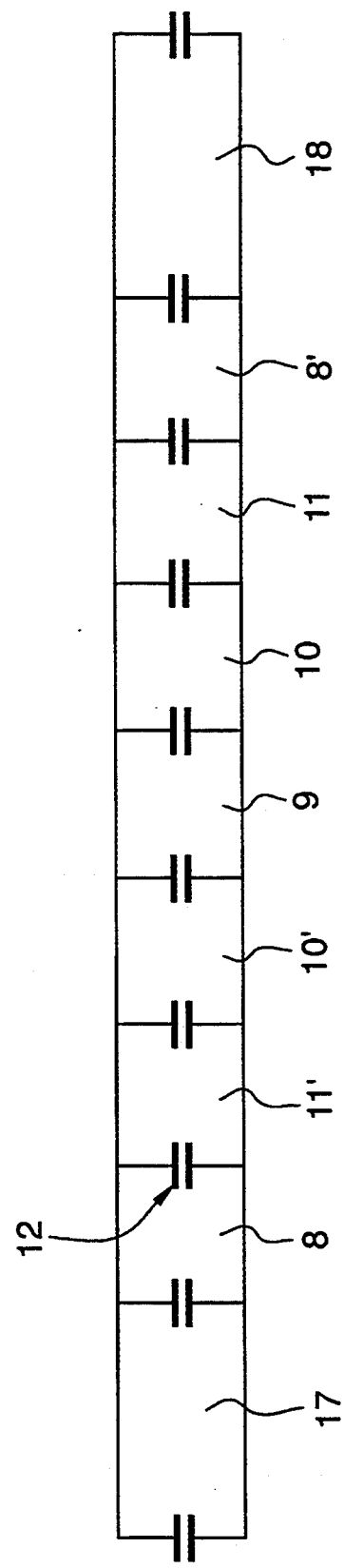
FIG - 6
FIG - 7

APPARATUS FOR DEPOSITION OF THIN-FILM, SOLID STATE BATTERIES

FIELD OF THE INVENTION

The present invention relates generally to thin-film, solid-state batteries and more specifically to apparatus for the deposition of thin-film, solid-state batteries.

BACKGROUND OF THE INVENTION

Rechargeable batteries are used in almost every aspect of daily life. A wide variety of industrial, commercial and consumer applications exist. Larger capacity battery uses include such applications as fork lifts, golf carts, uninterruptable power supplies for protection of electronic data storage, and even energy storage for power production facilities. When electric vehicles are manufactured in mass, demand for low weight, high charge capacity batteries will be greater than ever before. Indeed, to make mass use of electric vehicles economically feasible, very high specific capacity may be critically necessary.

In electric vehicles, weight is a significant factor. Because a large component of the total weight of the vehicle is the weight of the batteries, reducing the weight of the cells is a significant consideration in designing batteries to power electric vehicles.

The 1998 California Clean Air Act has posed an exceptional challenge on battery scientists and engineers to develop an improved battery that can support the commercialization of electric vehicles (EV). Needless to say, the law has not changed the reality of battery technology. In over 100 years of rechargeable battery usage, two chemistries namely: Pb-PbO$_2$ (known as lead-acid battery) and Cd-NiOOH (known as Ni-Cd battery) have dominate with more than 90% of the market. Neither of the two are likely to fulfill the utopian goals of powering an electric car that will match the range, economy, and performance of an internal combustion engine vehicle. Therefore, battery scientists and engineers are forced to study new battery chemistries.

In addition to industrial, commercial and other large scale uses of batteries, there are literally thousands of consumer applications of rechargeable batteries. A rechargeable electrochemical cell is ideally suited to serve as a portable power source due to its small size, light weight, high power capacity and long operating life. A rechargeable cell may operate as an "install and forget" power source. With the exception of periodic charging, such a rechargeable cell typically performs without attention and rarely becomes the limiting factor in the life of the device it powers.

Present rechargeable battery systems can be classified into two groups those employing liquid electrolytes and those employing solid electrolytes. Liquid electrolyte systems have been around for many decades and are the most well known to the general public. Examples of liquid electrolyte rechargeable battery systems include lead-acid, nickel cadmium, and the more recent nickel-metal hydride systems.

A more recent advancement is the solid electrolyte rechargeable battery systems. The solid electrolyte devices have several distinct advantages over those based on liquid electrolytes. These include (1) the capability of pressure-packaging or hard encapsulation to yield extremely rugged assemblies, (2) the extension of the operating temperature range since the freezing and/or boiling-off of the liquid phase, which drastically affect the device performance when employing liquid electrolytes are no longer a consideration, (3) solid electrolyte devices are truly leak-proof, (4) they have long shelf life due to the prevention of the corrosion of electrodes and of loss of solvent by drying out which occur when using liquid electrolytes, (5) solid electrolytes permit micro-miniaturization, and (6) the do not require heavy, rigid battery cases which are essentially "dead weight" because they provide no additional capacity to the battery but must be included in the total weight thereof.

All of the above considerations have led to a growing use of solid electrolytes. Solid state batteries and timers are already available which employ the solid electrolyte as a cylindrical pellet with suitable electrodes on either side. However, this kind of geometry leads to somewhat poor solid-solid contacts and these devices tend to have high internal resistances and polarization losses. These problems have been overcome by the use of thin films as the electrolytes, since thin films deposited on top of each other have excellent contacts and should also be able to withstand shocks, acceleration forces and spin rates without undue damage.

In forming such a battery system, a solid ion conductor (i.e. solid electrolyte) for moving ions within the system is required. A solid electrolyte is classified by its type of movable ion, such as $Li^+$-conductive solid electrolyte, $Ag^+$-conductive solid electrolyte, $Cu^+$-conductive solid electrolyte, $H^+$-conductive solid electrolyte, etc. A solid electrochemical element is constituted by combining one of these solid electrolytes with an appropriate electrode material. Several solid electrolytes are known to exhibit good ionic conductivity, some of which exist in the form of thin films. Oxide ion conductors such as zirconia are operated at high temperatures due to their low conductivity at ambient temperatures. Chloride ion conductors such as $PbCl_2$ and $BaCl_2$ have similar temperature restrictions. Silver ion such as AgBr, AgCl, and AgI also show low room temperature ionic conductivity.

Of the thin-film, solid state battery systems, lithium-polymer batteries have received the most widespread interest. Reports in 1979 that lithiated poly-ethyleneoxide (PEO) possesses lithium ion conductivity raised the expectations for a solid state battery employing PEO as solid electrolyte. Indeed, if PEO, or other polymers, were a true solid electrolyte with practical ionic conductivities and a cationic transfer number of 1, a stable interface with the lithium electrode and good charging uniformity could be realized. The expectations, no doubt, were stimulated by the relative success of the true solid electrolyte "B" Alumina, in the Sodium Sulphur battery.

More recently, several researchers proposed the use of "plasticized polymers" to enhance conductivity at room temperature. Although the term "plasticized polymers" is the correct material science terminology for the materials, they are in effect no different than a battery separator filled with organic solvent and electrolyte. In this case, we are back to liquid filled systems with all the old unsolved fundamental problems and several new ones.

Solid electrolytes consist of solid atomic structures which selectively conduct a specific ion through a network of sites in a two or three dimensional matrix. If the activation energy for mobility is sufficiently low, the solid electrolyte can serve as both the separator and electrolyte in a battery. This can allow one to fabricate an all solid state cell.

An important aspect of such electrolytes is that they selectively conduct only one type of ion. If that ion features reversible electrochemistry with both the positive and negative electrode of the battery, and if the solid electrolyte itself is inert to the electrodes, the cell will enjoy a uniform and reversible electrochemistry with no composition change and no passivation or side reactions.

While true solid electrolyte lithium conductors would not exhibit the inherent problems of Li-polymer systems described herein below, all polymer electrolytes reported to date are not true solid electrolytes. The conductivity occurs in an amorphous zone that conducts anions better than it conducts lithium ions (the transfer number of lithium is less than 0.5). As such, ion concentrations in the electrode surface are variable and irreversible reactions between the anion and the lithium electrodes do occur. The combination of the two effects brings about partial passivation of the lithium surface with non uniform dendritic plating on charge. Additionally, the conductivity of the polymer electrolyte is too low, typically two to four orders of magnitude lower than that of aqueous electrolyte. Also, the electrode area required for a 20 kwh battery is 42 m$^2$ for Ni-Cd batteries and is 1610 m$^2$ for Li-Polymer batteries. This data clearly conveys that in order to deliver acceptable power levels for EV applications, lithium polymer batteries will require nearly two orders of magnitude, larger electrode area per ampere hour than a higher power density Ni-Cd battery. Given that electrode processing is the most expensive component in battery production and that the cost of electrode processing is nearly linear with electrode area, the cost implications of the design are astonishing.

In addition to cost, safety of Li batteries, particularly liquid electrolyte systems, is always a problem. The single most important reason rechargeable lithium batteries have not been successful in the market place is their poor safety record. Most research groups that have worked on rechargeable lithium cells have "personally experienced" explosions, and explosions have occurred in the field. The problem can be diagnosed as follows: 1) lithium plating is dendritic, 2) dendrites eventually short through the separator, 3) shorted cells heat up during charging, 4) shorted cells will go into reversal during full battery discharge, 5) low capacity cells will go into reversal during full battery discharge, 6) in reversal, lithium is likely to plate on the cathode which can cause direct chemical reaction between cathode material and lithium, 7) processes 3 and 6 can generate enough heat to melt lithium (165 Centigrade), and 8) molten lithium is an extremely strong reducing agent which will react with most organic and inorganic materials. An explosion could occur depending on: (a) the amount of lithium in the cell, (b) the surface to volume aspect ratio of the cell, (c) the reactivity of the other cell components to lithium, (d) the vapor pressure of the products, and (e) the vent design.

Battery design should be aimed at minimizing the risk of lithium melt down. Given that it is extremely unlikely that lithium melt down can be completely avoided in mass usage of large rechargeable lithium batteries, it is essential to guarantee non explosion when the melt down does occur. Dry polymer electrolyte offers some improvement with regard to exposition when compared to high vapor pressure liquid electrolyte. However, that improvement is counteracted by the need for a very thin separator. Overall, the likelihood of ensuring explosion free melt downs in large cells and batteries is diminutive.

Cells utilizing polymer electrolytes that contain organic solvents, are as likely to be explosive as cells with standard (polymeric) separator and liquid electrolytes. In this case, depending on cell design, common experience places the explosion threshold in the 0.5 to 5 Ah size range; two orders of magnitude smaller than what is required for an EV battery. It should be noted that a cycled lithium electrode is more prone to explosion than a fresh uncycled one. While this fact has been known for quire some tine, lithium polymer battery developers have shied away from publishing safety test data on cycled cells.

In spite of its safety problems, there is a continued interest in lithium batteries because of their purportedly high power density. This feature makes rechargeable lithium batteries attractive. Theoretical energy densities of most rechargeable lithium chemistries are two and a half to three times higher than that of Pb-Acid and Ni-Cd batteries. Indeed, liquid electrolyte rechargeable lithium batteries could be made to deliver up to 150 Wh/Kg and 200 Wh/liter. This is about three times higher than the practical gravimetric energy density delivered by the best Ni-Cd batteries and four times higher than the practical gravimetric energy density delivered by the best Pb-Acid batteries. However, the design of the lithium polymer batteries, driven by the poor conductivity of the polymer electrolyte, is very volume inefficient. Specifically, the separator occupies 30% of the stack volume, carbon is added to the positive electrode in concentration of up to 30% and the positive electrode utilization is poor. Thus, the practical energy density is likely to be considerably lower than of what can be achieved with liquid electrolyte. Estimated deliverable energy density of lithium polymer batteries is 15–20% of the theoretical energy density. This translates to (using 485 Wh/Kg as theoretical maximum) approximately 70 to 100 Wh/Kg at best. Most likely, compromises that will have to be made to improve manufacturability, safety and cycle life beyond the current laboratory state-of-the-an technology. This will have the effect to reduce the practical energy density to even below the values proposed above. The power capability of a battery depends upon the physical and chemical properties of the cell components as well as the cell design. Lithium polymer battery developers are trying to counteract the poor inherent conductivity of the polymer electrolytes by reducing the electrode and separator thickness. Because practical manufacturing reality is likely to impose increases in the electrolyte thickness from approximately 2 to 4 mil, the power deliverable by the cell is likely to drop by 30 to 50%.

An area that requires closer attention is power degradation over life. The main degradation mechanism of the cell involves irreversible reactions between lithium and electrolyte. This reduces the conductivity of the electrolyte as well as increases the impedance of the Lithium electrode due to the formation of passive films; both effects reduce the deliverable power from the battery. Because the cycle life of the lithium polymer battery is short, significant degradation in power is likely to occur in less than 100 cycles.

Other problems arise from real life usage and requirements placed upon battery systems. Traction batteries are assembled from a string of individual cells connected in series. During both charge and discharge, the same amount of current will pass through all the cells. In practical manufacturing and usage, it is impossible to keep all cells at exactly the same state of charge. This forces a weak cell in a battery to go into reverse during deep discharge and some cells to go into overcharge during full charge. For a battery to operate at deep discharge cycles, it is essential that individual cells tolerate reverse or overcharge without damage or safety implications.

Lithium batteries are very poor in this respect. Over discharge will result in plating lithium on the positive electrode which can result in a spontaneous chemical reaction with severe safety implications. Overcharge is likely to result in electrolyte degradation that can generate some volatile gasses as well as increase cell impedance. These problems are particularly severe for lithium cells because: 1) degradation occurs during cycle life, therefore, even if initial capacities are matched very closely, it is unreasonable to expect that the degradation rate will be identical for all cells, 2) the cells tend to develop soft or hard shorts, thereby making it impossible to maintain the cells at the same state of charge at all times, and 3) cell capacity is dependent on temperature, therefore cells that are physically cooler due to their location will deliver less capacity than others. These conditions make the likelihood of cell reversal, relatively early in the life of the battery, very high. Of course, cell reversal is likely to result in venting and or explosion.

It has been propose to install individual diode protection for all cells which could be an expensive, although practical, solution for a portable low watt-hour battery. The increased cost and reduced reliability associated with this solution makes this very undesirable for an EV battery. Plus, the inherent lack of overcharge and over discharge capability eliminates any possibility of ever developing a rechargeable lithium-polymer battery of a bipolar design.

An additional problem with the commercialization of Li-polymer batteries is their high cost. It is difficult to assess the cost, although clearly, processing cost per watt-hour should be much higher than that of traditional batteries. Raw material costs are clearly higher than Pb-Acid, although, it may be similar to Ni-Cd. The cost of raw material will rise due to high purity requirements. There are convincing reasons to expect that lithium polymer batteries, if ever made commercially, will be considerably more expensive than Ni-Cd batteries considering that: 1) primary Li-MnO$_2$ cells, which are in mass production, are still more expensive than Ni-Cd cells, 2) the purity requirements for a secondary cell are much higher than that of a primary cell, and 3) the electrode area per watt-hour of a lithium polymer secondary battery will be approximately an order of magnitude larger than that of a primary Li-MnO$_2$ battery.

Even more problematic than the cost factor is the low cycle life of the lithium polymer batteries, which is particularly important in EV applications. Small rechargeable lithium batteries employing organic liquid electrolyte have delivered 100 to 400 cycles in laboratory tests. It is anticipated that lithium polymer electrolyte batteries of the same size could be made to deliver a comparable number of cycles. However, all the data published to date on lithium polymer batteries was run on cells with a very large amount of excess lithium, therefore, no conclusion can be drawn at this stage.

The cycle life of a large multi cell battery is likely to be considerably lower than that of a small two-cell battery. Additional reduction of the expected cycle life results from consideration of the fact that the battery will be limited by the weakest cell, and as previously mentioned, the likelihood of temperature or electrical imbalance is high. Further, power may degrade faster than capacity, so cycle life could become limited due to an unacceptable drop in power. Therefore, it is probably a fair assumption that if a full size battery was built at today's state-of-the-art technology, it could possibly make 100 cycles or so, which is about an order of magnitude short of what is required for an EV.

Therefore, since lithium-polymer batteries will be inadequate to meet today's requirements for a universally acceptable, thin-film, solid state rechargeable secondary battery system, other solid state systems need to be developed. Additionally, there is a need for an apparatus to easily and economically fabricate such batteries.

SUMMARY OF THE INVENTION

The instant invention comprises a multi-chambered deposition apparatus for depositing solid-state, thin-film battery materials onto substrate material. The apparatus minimally includes at least three distinct evacuable deposition chambers, which are physically interconnected in series. The first deposition chamber is adapted to deposit a layer of battery electrode material having a first polarity onto the substrate. The second deposition chamber is adapted to deposit a layer of solid-state electrolyte material onto the layer of battery electrode material deposited in the first chamber. The third deposition chamber is adapted to deposit a layer of battery electrode material having an opposite polarity from that deposited in the first chamber onto the solid-state electrolyte. The deposition chambers are interconnected by gas gates such that the substrate material is allowed to proceed from one deposition chamber to the next, while maintaining gaseous segregation between the chambers.

In a second embodiment, the apparatus includes an evacuable substrate insertion chamber which is physically interconnected in series to the first deposition chamber. The insertion chamber is adapted to hold one or more individual substrates and pass them to the first deposition chamber. This second embodiment also includes an evacuable substrate retraction chamber which is physically interconnected in series to the third deposition chamber. The retraction chamber is adapted to hold one or more individual substrates and remove them from the third deposition chamber. Also, the deposition apparatus includes an interconnective passageway connecting the retraction chamber and the insertion chamber such that the substrate may undergo multiple depositions by recycling the previously deposited substrate from the retraction chamber to the insertion chamber. The deposition apparatus includes a fourth evacuable deposition chamber between the third deposition chamber and the retraction chamber. The fourth chamber is adapted to deposit a top conductive battery terminal upon the second battery electrode layer.

In a third embodiment, the apparatus includes an evacuable payout chamber which is physically interconnected in series to the first deposition chamber. The payout chamber holds a roll of substrate material, which is unrolled and passed to said first deposition chamber.

Also, this third embodiment includes an evacuable take-up chamber which is physically interconnected in series to the third deposition chamber. The roll of substrate material upon which the solid-state battery material has been deposited passes from the third deposition chamber into the take-up chamber and is collected on a take-up mandrel.

This third embodiment of the apparatus can be adapted to deposit a plurality of solid state battery cells onto the substrate. To that end, the first and third deposition chambers and the payoff and take-up chambers are, respectively, reversible. Therefore, when the roll of substrate material has undergone one pass through the deposition chambers, the direction of the substrate can be reversed and the substrate thereby passed through the deposition chambers again. When the reversal occurs, 1) the take-up chamber becomes the payoff chamber, 2) the payoff chamber becomes the take-up chamber, 3) the third deposition chamber becomes the first deposition chamber and deposits the battery electrode material having the first polarity onto the substrate, and 4) the first deposition chamber becomes the third deposition chamber and deposits the opposite polarity battery electrode material onto the substrate.

The apparatus of this third embodiment may also include one or both of a fourth evacuable deposition chamber positioned between said first deposition chamber and said payoff chamber and a fifth evacuable deposition chamber positioned between said third deposition chamber and the take-up chamber. The fourth and fifth deposition chambers are adapted to deposit current collector layers between the second electrode layer of a first deposited battery and the first electrode of the next deposited battery and also a top conductive battery terminal upon the second battery electrode layer of the last deposited battery.

A fourth embodiment, which is essentially a modification of the third embodiment, is adapted to deposit a plurality of solid state battery cells onto the substrate. The payoff and take-up chambers are again reversible so that when said roll of substrate material has undergone one pass through said deposition chambers, the direction of travel of said substrate can be reversed and said substrate can undergo another pass through the deposition chambers. However, two additional deposition chambers, identical to the first and the third deposition chambers, are included in the apparatus. The additional chambers are activated when the direction of travel of the roll of substrate material is reversed. The additional reverse direction deposition chambers are positioned on the opposite side of the second deposition chamber from its forward direction counterpart.

The fourth embodiment can also include an additional set of evacuable deposition chambers, which are positioned on opposite sides of the second deposition chamber. The additional set of chambers are adapted to deposit a conductive current collector layer atop a deposited battery cell. One chamber is positioned to deposit the conductive layer when the substrate is traveling in the forward direction and the other to deposit the conductive layer when the substrate is traveling in the reverse direction.

The deposition chambers of the instant invention are preferably adapted to deposit materials by at least one method selected from the group consisting of evaporation, chemical vapor deposition, physical vapor deposition, microwave plasma enhanced chemical vapor deposition, sputtering, laser ablation, spray coating, or plasma spraying.

BRIEF DESCRIPTION OF THE FIGURES

FIG. 6 is a highly schematic depiction of a fourth embodiment of the instant invention specifically illustrating another multi-pass deposition apparatus for depositing multi-celled batteries atop elongated webs of substrate material, in addition to those features of FIG. 5, this apparatus includes two additional deposition chambers in which layers of positive and negative electrode materials are deposited.

FIG. 7 is a highly schematic depiction of a fifth embodiment of the instant invention specifically illustrating yet another multi-pass deposition apparatus for depositing multi-celled batteries atop precut webs of substrate material, in addition to those features of FIG. 4, this apparatus includes two additional deposition chambers in which layers of positive and negative electrode materials are deposited, it should be noted that since the substrate travels back and forth from insertion chamber to retraction chamber through the deposition chambers, no connective passageway between the insertion and retraction chambers is required.

DETAILED DESCRIPTION OF THE INVENTION

Figure 1:
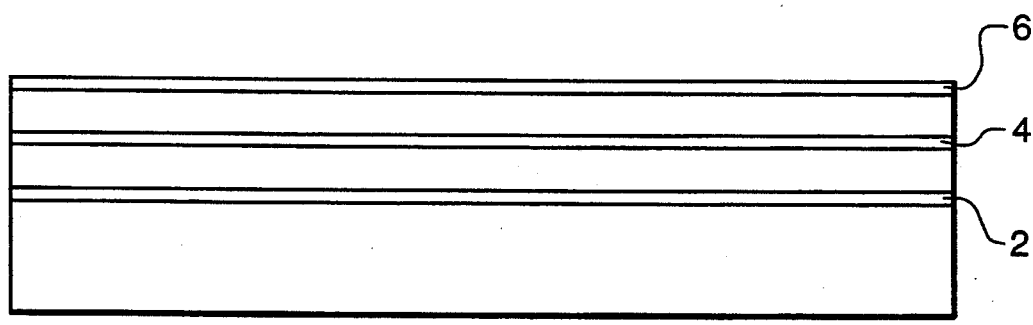
FIG. 1 is a cross-sectional depiction of a first embodiment of a solid state battery of the type to be produced by the deposition apparatus of the instant invention and specifically illustrating the individual layers thereof.

Before, describing the production apparatus of the instant invention, it will be helpful to describe the particular type of solid state batteries to be manufactured. FIG. 1 is a cross-sectional depiction of a thin-film solid state battery of the type to be deposited by the apparatus of the present invention. Specifically, reference numeral 1 is the substrate of the thin-film battery. The substrate provides support for the battery and may also serve as the bottom electrical terminal of the battery. Substrate 1 may be formed from an electrically conductive metal such as aluminum, nickel, copper or stainless steal, or it may be formed from a light weight, electrically insulating polymer or ceramic material. If the substrate 1 is formed of an electrically insulating material or is reactive with the battery electrode materials, then an electrically conductive bottom battery terminal layer 2 is deposited onto the substrate. The material used to form the battery terminal layer 2 may be an electrically conductive metal such as aluminum, nickel, copper, molybdenum or may even be an electrically conductive ceramic or oxide material. For maximum weight savings, the substrate 1 plus any battery terminal layer 2 should be only as thick as needed to perform their support and conduction functions. Any additional thickness will only increase the "dead weight" of the battery. Typically the total thickness of the substrate 1 plus the battery terminal layer 2 will not be greater than about 200 microns and preferably not greater than about 50 to 100 microns. The battery terminal layer 2 is preferably between 0.5 and 5 microns thick. Deposited on top of the substrate 1 and battery terminal layer 2 is at least one multi-layered electrochemical cell. Each electrochemical cell includes a thin-film negative electrode layer 3, a thin-film positive electrode layer 5 and a thin-film solid electrolyte proton conductive layer 4.

The thin-film negative electrode layer 3 is typically between about 1 and 15 microns thick and is formed from a material which electrochemically adsorbs and desorbs ions such as ionic hydrogen or lithium during charging and discharging thereof, respectively. Typically the layer is formed from electrochemical hydrogen storage materials such as metal hydride materials. These metal hydride material may be any of those already known any used in liquid electrolyte nickel-metal hydride batteries. These materials may be $AB_2$ or $AB_5$ type metal hydride materials. They may be amorphous, polycrystalline, microcrystalline, nanocrystalline, single crystal or multi-structural materials. They may include only a single compositional phase or may include multiple compositional phases. An extensive review of the known metal hydride materials useful in electrochemical cells is given in U.S. Pat. No. 5,096,667, the disclosure of which is incorporated herein by reference.

In addition to the known metal hydride materials, new metal hydride systems can be developed to take advantage of the environmental differences between an alkaline liquid electrolyte system and the new thin-film solid electrolyte systems. For example, in a liquid electrolyte system, there is generally a problem with corrosion of the electrode due to the caustic nature of the alkaline electrolyte. Therefore, elements which provide corrosion resistance must be added to the negative electrode material to mitigate corrosion damage. In the solid electrolyte system of the present invention, no such corrosion problems will occur due to the absence of caustic liquids and as such, no corrosion inhibitor materials will need to be added to the negative electrode. Alternatively, in the case of lithium systems, metallic lithium or lithium intercalated carbon can be used as the negative electrode layer 3.

The positive electrode layer 5 is typically between 5 and 20 microns thick and is formed from a material which electrochemically desorbs and adsorbs ions such as ionic hydrogen or lithium during charging and discharging thereof, respectively. Typically the layer is formed from a transition metal hydroxide such as nickel hydroxide material. The nickel hydroxide material can be any of those material known in the prior art for use in rechargeable battery systems. They may also be advanced active materials like the locally ordered, disordered, high capacity, long cycle life positive electrode material disclosed in U.S. patent application Ser. No.s 7/975,031 filed Nov. 12, 1992 and 8/027,973 filed Mar. 8, 1993, the disclosures of which are incorporated herein by reference. These materials include a solid solution nickel hydroxide electrode material having a multiphase structure and at least one compositional modifier to promote said multiphase structure. The multiphase structure comprises at least one polycrystalline $\gamma$-phase including a polycrystalline T-phase unit cell comprising spacedly disposed plates with at least one ion incorporated around the plates, the plates having a range of stable intersheet distances corresponding to a 2+ oxidation state and a 3.5+ or greater, oxidation state. The compositional modifier is a metal, a metallic oxide, a metallic oxide alloy, a metal hydride, and/or a metal hydride alloy. Preferably the compositional modifier is chosen from the group consisting of Al, Bi, Co, Cr, Cu, Fe, In, $LaH_3$, Mn, Ru, Sb, Sn, $TiH_2$, TiO, Zn and mixtures thereof. More preferably, at least three of these compositional modifiers are used. The at least one chemical modifier incorporated is preferably chosen from the group consisting of Al, Ba, Ca, Co, Cr, Cu, F, Fe, K, Li, Mg, Mn, Na, Sr, and Zn.

Also, for lithium ion systems, the positive electrode layer 5 can be formed from a material such as lithium nickelate ($LiNiO_4$), lithium cobaltate or ($LiCoO_4$) lithium manganate ($LiMnO_4$), vanadiom oxide, titanium disulfide, etc..

Between the negative electrode layer 3 and the positive electrode layer 5, is deposited a thin-film solid state electrolyte layer 4. This layer is typically between about 0.5 and 2 microns thick, but may be as thin as 1000 Angstroms if the layer onto which it is deposited has a low degree of surface roughness. The type of ionic conductivity required of the solid electrolyte is dependent on the electrochemical reactions involved in the cell. Since the charging cycle electrode reactions of the rechargeable protonic battery are:

$$M + H^+ + e^- \text{-CHARGE} > MH; \text{ and}$$

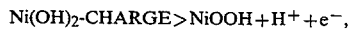

$$Ni(OH)_2 \text{-CHARGE} > NiOOH + H^+ + e^-,$$

the solid state electrolyte layer 4 which separates the positive electrode layer 5 and the negative electrode layer 3 must be a proton conductor. That is, the solid electrolyte material must be capable of readily conducting or transporting protons from the positive electrode layer 5 to the negative electrode layer 3 while the battery is charging and from the negative electrode layer 3 to the positive electrode layer 5 while the battery is discharging. The solid electrolyte layer 4 must also be electrically insulating so that the battery electrodes do not short. That is, the electrolyte also acts as the electrode separator. The present inventors have found that a hydrogenated electrical insulator has all of the characteristics required. Typically this is a hydrogenated silicon nitride material, but hydrogenated silicon oxide or hydrogenated silicon oxynitride may also be used. Preferably the hydrogenated silicon nitride material has a composition, in atomic percent, of between about 20% and about 50% Hydrogen, between about 20% and about 40% silicon and about 20% to about 50%. The ration of silicon to nitrogen is generally between about 2:1 and about 1:2, but may be varied outside this range if specifically advantageous under the circumstances.

Alternatively, for the lithium systems, the charging electrode reactions are:

therefore, in the lithium systems, a lithium conductor is needed. Solid lithium conductors useful as the ionic conductor layer 4 are lithiated silicon nitride ($Li_8SiN_4$), lithium phosphate ($LiPO_4$), lithium titanium phosphate ($LiTiPO_4$) and lithium phosphonitride ($LiPO_{4-x}N_x$ where $0<x<1$).

A top battery terminal layer 6 is deposited on top of the positive electrode layer 5. The battery terminal layer 6 is typically between 1 and 5 microns thick and is formed from an electrically conductive material such as a metal or an electrically conductive ceramic or oxide. Specifically, aluminum, copper, molybdenum or nickel may be used.

Figure 2:
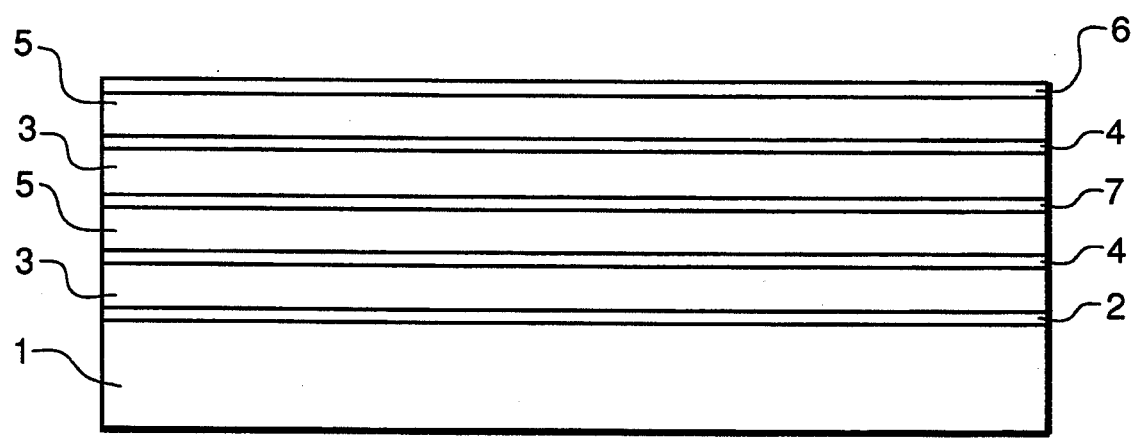
FIG. 2 is a cross-sectional depiction of a second embodiment of a solid state battery of the type to be produced by the deposition apparatus of the instant invention and specifically illustrating the individual layers thereof, including plural electrochemical cells and current collectors therebetween.

FIG. 2 depicts a solid state battery of the type to be deposited by the apparatus of the instant invention containing multiple stacked electrochemical cells. The reference numeral of the layers of this battery correspond to those of the battery depicted in FIG. 1. Additionally, because this battery includes more than one electrochemical cell, a layer of current collecting material 7 is deposited between positive electrode layer 5 of one cell and the negative electrode layer 3 of the adjacent cell. This layer is formed of an electrically conductive material and is typically between 1000 angstroms and 0.5 microns thick. Preferably this layer is formed from a metal such as aluminum, copper, molybdenum or nickel and is resistant to the conduction of protons.

One final interesting and useful product variation which should be noted is the deposition of these thin-film batteries onto stainless steel substrates on the opposite side of thin-film amorphous silicon solar cells to integrate the collection and storage of solar energy.

Now that a basic description of the product to be manufactured has been provided, a detailed description of the deposition apparatus of the instant invention is presented. FIG. 1 depicts a first, basic embodiment of the apparatus of the instant invention. The basic apparatus includes three interconnected deposition chambers 8, 9 and 10. The deposition chambers are physically interconnected by gas gates 12. The gas gates allow a substrate to be passed form one deposition chamber to another while preventing cross contamination of gasses therebetween. The chambers are specifically adapted to deposit battery materials onto the substrate. The solid-state battery is deposited upon the substrate as it passes through the chambers.

Initially, the substrate is passed to the first deposition chamber 8, where a first electrode layer (ref. numeral 3 of FIG. 1) of battery electrode material having first polarity (such as a positive battery electrode material) is deposited thereon.

The substrate having the first battery electrode layer deposited thereon is now transported to the second deposition chamber 9 through gas gate 12. In the second deposition chamber 9 a solid state electrolyte layer (ref. numeral 4 of FIG. 1 ) is deposited upon the first electrode layer.

Next, the substrate with its deposited layers is passed through another gas gate 12 into the third deposition chamber 10. In the third deposition chamber, a layer of electrode material (ref. numeral 5 of FIG. 1 ) of opposite polarity (such as a negative electrode material) from the first electrode is deposited upon the layer of solid-state electrolyte material.

Now that the second electrode layer has been deposited, the formed solid-state battery is optionally passed to a fourth chamber where a conductive top battery terminal layer (ref. numeral 6 of FIG. 1) is deposited upon the second electrode layer. The top terminal deposition chamber 17 and its attendant layer may be omitted if desired when the materials of the second battery electrode layer are also suitable to additionally act the top battery terminal. Once the cell is finished, the battery can be removed from the apparatus via another gas gate 12.

The deposition chambers and gas gates are formed from materials which are chemically inert to the materials of construction of the solid-state batteries and to the deposition processes used in the production thereof. The contemplated deposition processes include, but are not limited to, sputtering, evaporation, chemical vapor deposition (CVD), microwave plasma enhanced CVD (PECVD), radio frequency PECVD, physical vapor deposition (PVD), plasma enhanced PVD, laser ablation, spray coating, and plasma spraying. The choice of deposition process will depend upon many factors such as materials to be deposited, precursor starting materials used, pressures/vacuums required by the process (in relation to the pressure of the process in the adjacent chambers), cost, electrochemical and physical quality of deposited materials, and others.

Figure 4:
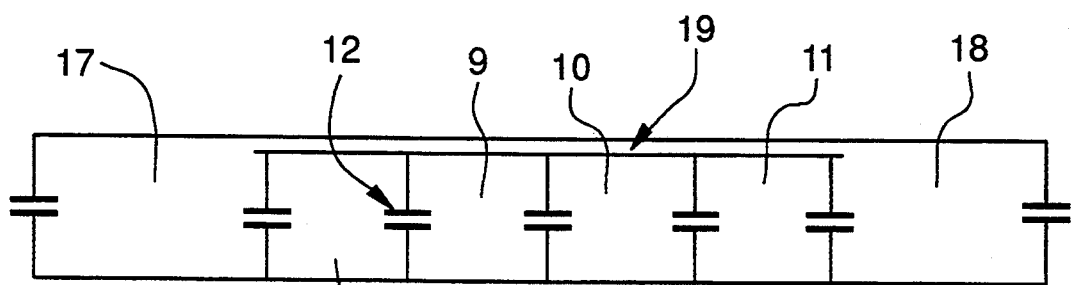
FIG. 4 is a highly schematic depiction of a second embodiment of the instant invention specifically illustrating a multi-pass deposition apparatus for depositing multi-celled batteries atop pre-cut pieces of substrate material, in addition to those features of FIG. 3, this apparatus includes a substrate insertion chamber, a substrate retraction chamber, an interconnective passageway connecting said retraction chamber and said insertion chamber and an additional deposition chambers in which current collector layers are deposited.

Turning now to FIG. 4, there is depicted therein a second embodiment of the instant invention. This embodiment comprises a deposition apparatus for depositing single or multi-celled solid-state batteries upon pre-cut substrates, as needed. That is, the apparatus can be run in either single-pass or multi-pass mode, single-pass mode depositing a single-celled battery and multi-pass mode depositing multi-celled batteries. By the term "precut" is meant a substrate which is of relatively limited length and width dimensions when compared with the rolls of substrate web which can be as long as 2000 feet or more.

Figure 3:
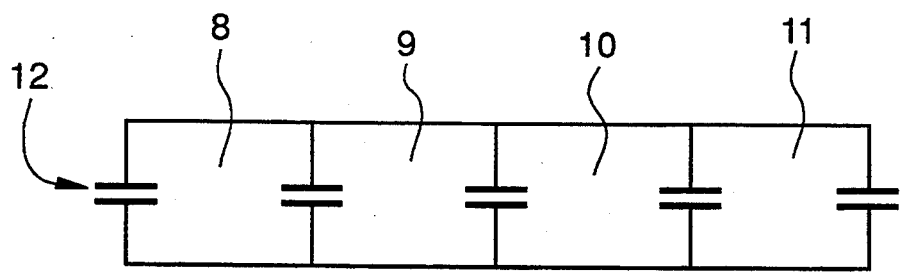
FIG. 3 is a highly schematic depiction of a first embodiment of the instant invention, specifically indicating the positive and negative electrode deposition chambers, the solid-state electrolyte deposition chamber, and interconnective gas gates therebetween.

Typically, one or more precut substrates are loaded into the substrate insertion chamber 17 through a gas gate 12. The insertion chamber 17 is physically interconnected in series to the first deposition chamber 8 and is adapted to hold one or more precut substrates and pass them sequentially through a gas gate 12 into the first electrode chamber 8. Once the substrate enters the first deposition chamber 8, deposition proceeds as described hereinabove with reference to FIG. 3.

If the apparatus is being used in single-pass mode, the deposited batteries are then collected in the substrate retraction chamber 18. The substrate retraction chamber 18 is physically interconnected in series to either the top conductive battery terminal deposition chamber or the third deposition chamber if a top conductive battery terminal is not required. The substrate retraction chamber 18 is adapted to hold one or more individual substrates for removal from the system through another gas gate 12.

Alternatively, if the system is being used in a multi-pass mode, the substrate having one or more cells deposited thereon is transferred from the substrate retraction chamber 18 to the substrate insertion chamber 17 along interconnective passageway 13 and thereafter transported from the insertion chamber 17 to the first deposition chamber. In this manner, a multi-celled battery can be deposited onto a single substrate without having to remove the substrate from the apparatus. In multi-pass mode, deposition chamber 11 is adapted deposit a current collector layer (ref. numeral 7 of FIG. 2) upon the second electrode layer (ref. numeral 5 of FIG. 2) of each cell and a conductive top battery terminal upon the final cell of the multi-celled battery.

Figure 5:
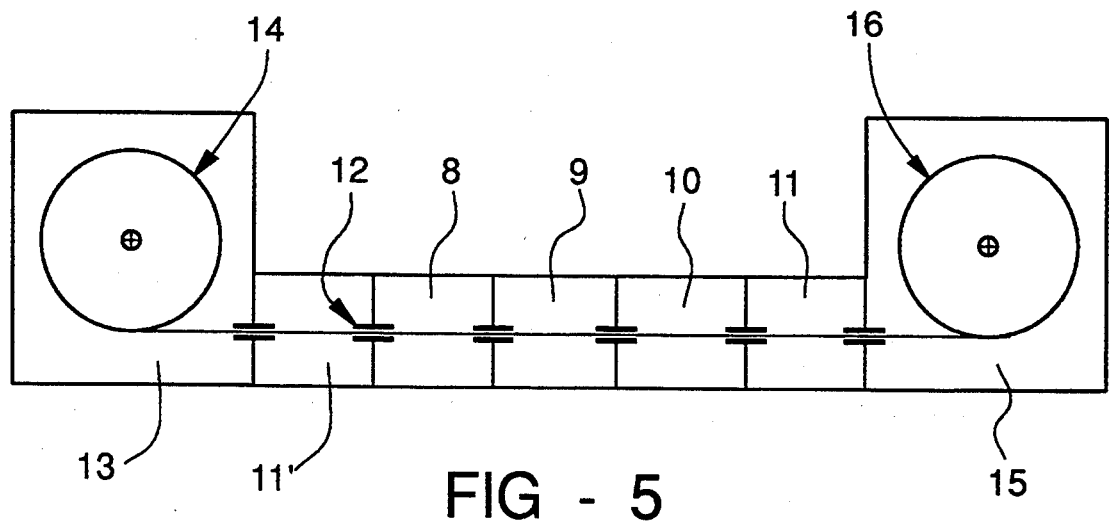
FIG. 5 is a highly schematic depiction of a third embodiment of the instant invention specifically illustrating a multi-pass deposition apparatus for depositing multi-celled batteries atop elongated webs of substrate material, in addition to those features of FIG. 3, this apparatus includes substrate take-up and payout chambers and two additional deposition chambers in which current collector layers are deposited.

In yet another embodiment of the instant invention, the solid-state batteries can be deposited on an elongated web of substrate material. FIG. 5 depicts an apparatus to accomplish this deposition. The elongated web of substrate material is unrolled from a roll 14 thereof in payout chamber 13 which is serially connected to the deposition chambers by a gas gate 12. Once the elongated web of substrate material leaves the payout chamber 13, it is transported to the deposition chambers. The deposition chambers minimally include the electrode deposition chambers 8 and 10 and the solid-state electrolyte deposition chamber 9 (as described herein above with respect to FIG. 3). As with the apparatus of FIG. 3, the present embodiment may include an additional chamber 11, adapted to deposit a conductive top battery terminal, if desired. Once the battery has been deposited, the final product is collected on take-up roller 16 in the take-up chamber 15, which is serially connected to the second electrode deposition chamber (or the top battery terminal deposition chamber 11 if such is included).

In addition to the single-pass mode described, the apparatus of FIG. 5 can be run in a multi-pass mode. In multi-pass mode, the apparatus is designed to be reversible. That is, once a single battery cell has been deposited, along with a current collector layer (ref. numeral 7 of FIG. 2), the direction of travel of the web substrate materials is reversed, such that the take-up chamber 15 becomes the payout chamber, and the payout chamber 13 becomes the take-up chamber. Also, the roles of the second electrode deposition chamber 10 and the first electrode deposition chamber 8 are reversed such that the first electrode material is deposited in the second electrode chamber 10 and the second electrode material is deposited in the first electrode chamber 8. Finally, the current collector deposition chamber 11 is deactivated when the substrate direction is reversed and, an additional current collector deposition chamber 11' is positioned between chamber 13 and chamber 8.

Once the second battery cell is deposited upon the first, the direction of travel of the substrate is again reversed. Chamber 11' is deactivated, chamber 11 is activated, and finally, chambers 13 and 15, and chambers 8 and 10 again reverse jobs, respectively. This reversal continues until the desired number of cells are deposited upon the substrate. During the final cell deposition pass, chamber 11 (or 11') deposits the top battery terminal, as needed.

FIG. 6 depicts another multi-pass embodiment of the instant invention. Operation of the present embodiment is substantially similar to operation of the embodiment of FIG. 5, with one noticeable exception. Instead of reversing the function of the first electrode deposition chamber 8 and the second electrode deposition chamber 10, additional, reverse direction deposition chambers 8' and 10' are added to the apparatus. These chambers, like the reverse direction current collector deposition chamber 11', are inactive when the apparatus is being operated in the forward direction, and are only activated in multi-pass mode when direction of travel of the substrate is reversed.

The ordering of the deposition chambers shown in FIG. 6 is but one of a multitude of orderings which will allow for proper forward and reverse depositions. The specific ordering chosen will depend greatly upon the battery system to be deposited and the methods available (i.e. CVD, PVD etc.) for the deposition of the components of that battery system. One consideration when choosing from a plurality of deposition methods will be the need to minimize the pressure differential between adjacent chambers.

The specific order of deposition chambers depicted in FIG. 6 is particularly useful in depositing a vanadium oxide/silicon nitride/lithium metal multi-celled solid state battery upon a continuous web of aluminum or stainless steel foil. The first electrode chamber 8 is adapted to deposit vanadium oxide by evaporation. The solid-state electrode deposition chamber 9 is adapted to deposit a silicon nitride material (such as a hydrogenated or lithiated silicon nitride) by sputtering. The second electrode deposition chamber 10 is adapted to deposit metallic lithium by evaporation. Finally, the current collector layer deposition chamber 11 is adapted to deposit molybdenum by evaporation.

FIG. 7 depicts a final multi-pass embodiment of the instant invention. Operation of the present embodiment is substantially similar to operation of the embodiment of FIG. 4, with two noticeable exceptions. Additional, reverse direction deposition chambers 8', 10' and 11' are added to the apparatus and the interconnective passageway 19 is eliminated. These chambers, like the reverse direction current collector deposition chamber 11' (of FIG. 5), are inactive when the precut substrate is being passes in the forward direction from insertion chamber 17 to retraction chamber 18, and are only activated in multi-pass mode when direction of travel of the substrate is reversed for a second depostion pass.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A multi-chambered deposition apparatus for depositing solid-state, thin-film battery materials onto substrate material, said apparatus including:

at least three distinct evacuable deposition chambers, said deposition chambers physically interconnected in series;

the first of said deposition chambers adapted to deposit battery electrode material having a first polarity onto the substrate;

the second of said deposition chambers adapted to deposit solid-state electrolyte material onto the battery electrode material deposited in the first chamber;

the third of said deposition chambers adapted to deposit battery electrode material of the opposite polarity from that deposited in the first chamber; and at least two gas gates, each gas gate interconnecting two of said deposition chambers such that the substrate material is allowed to proceed from one deposition chamber to the next, while maintaining gaseous segregation between the chambers.

2. A deposition apparatus as in claim 1, further including an evacuable payout chamber, said payout chamber physically interconnected in series to said first deposition chamber and holding a roll of substrate material, which is unrolled and passed to said first deposition chamber; and a gas gate interconnecting said payout chamber and said first deposition chamber.

3. A deposition apparatus as in claim 2, further including an evacuable take-up chamber, said take-up chamber physically interconnected in series to said third deposition chamber and holding a take-up mandrel for the roll of substrate material upon which the solid-state battery material is deposited, the substrate passing from said third deposition chamber into said take-up chamber; and a gas gate interconnecting said take-up chamber and said third deposition chamber.

4. A deposition apparatus as in claim 3, wherein said deposition apparatus is adapted to deposit a plurality of solid state battery cells onto said substrate, and to that end, said first and said third deposition chambers and said payoff and take-up chambers are, respectively, reversible, such that when said roll of substrate material has undergone one pass through said deposition chambers, the direction of said substrate can be reversed and said substrate can undergo another pass through the deposition chambers, when this reversal occurs:

1) the take-up chamber becomes the payoff chamber;
2) the payoff chamber becomes the take-up chamber;
3) the third deposition chamber becomes the first deposition chamber and deposits said battery electrode material having said first polarity onto the substrate; and
4) the first deposition chamber becomes the third deposition chamber and deposits said opposite polarity battery electrode material onto the substrate.

5. A deposition apparatus as in claim 3, further including a fourth evacuable deposition chamber between said third deposition chamber and said take-up chamber, said fourth chamber being adapted to deposit a top conductive battery terminal upon the second battery electrode layer.

6. A deposition apparatus as in claim 4, further including a fourth evacuable deposition chamber between said first deposition chamber and said payoff chamber; and a fifth evacuable deposition chamber between said third deposition chamber and said take-up chamber, said fourth and fifth deposition chambers being adapted to deposit current collector layers between the second electrode layer of a first deposited battery and the first electrode of the next deposited battery and a top conductive battery terminal upon the second battery electrode layer of the last deposited battery.

7. A deposition apparatus as in claim 1, further including an evacuable substrate insertion chamber, said insertion chamber physically interconnected in series to said first deposition chamber and adapted to hold one or more individual substrates and pass them to said first deposition chamber; and a gas gate interconnecting said insertion chamber and said first deposition chamber.

8. A deposition apparatus as in claim 7, further including an evacuable substrate retraction chamber, said retraction chamber physically interconnected in series to said third deposition chamber and adapted to hold one or more individual substrates and remove them from said third deposition chamber; and a gas gate interconnecting said retraction chamber and said third deposition chamber.

9. A deposition apparatus as in claim 8, further including an interconnective passageway connecting said retraction chamber and said insertion chamber such that the substrate may undergo multiple depositions by recycling the previously deposited substrate from the retraction chamber to the insertion chamber.

10. A deposition apparatus as in claim 8, further including a fourth evacuable deposition chamber between said third deposition chamber and said retraction chamber, said fourth chamber being adapted to deposit a top conductive battery terminal upon the second battery electrode layer.

11. A deposition apparatus as in claim 3, wherein said deposition apparatus is adapted to deposit a plurality of solid state battery cells onto said substrate, said payoff and take-up chambers are reversible so that when said roll of substrate material has undergone one pass through said deposition chambers, the direction of travel of said substrate can be reversed and said substrate can undergo another pass through the deposition chambers, to that end, two additional deposition chambers, identical to said first and said third deposition chambers, are included in the apparatus, the additional chambers are activated when the direction of travel of said roll of substrate material is reversed and the additional reverse direction deposition chambers are positioned on the opposite side of said second chamber from its forward direction counterpart.

12. A deposition apparatus as in claim 11, further including an additional set of evacuable deposition chambers, each chamber of said set being positioned on opposite sides of said second deposition chamber and adapted to deposit a conductive layer atop a deposited battery cell, one chamber is positioned to deposit the conductive layer when the substrate is traveling in the forward direction and the other to deposit the conductive layer when the substrate is traveling in the reverse direction.

13. A deposition apparatus as in claim 1, wherein said deposition chambers are adapted to deposit materials by at least one method selected from the group consisting of evaporation, chemical vapor deposition, physical vapor deposition, microwave plasma enhanced chemical vapor deposition, sputtering, laser ablation, spray coating, or plasma spraying.

14. A deposition apparatus as in claim 1, wherein said first deposition chamber is adapted to deposit a positive electrode material.

15. A deposition apparatus as in claim 1, wherein said first deposition chamber is adapted to deposit a negative electrode material.

* * * * *